United States Patent
Okawara

(10) Patent No.: US 11,004,815 B2
(45) Date of Patent: May 11, 2021

(54) SEMICONDUCTOR DEVICE

(71) Applicant: DENSO CORPORATION, Kariya (JP)

(72) Inventor: Jun Okawara, Nagakute (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/546,820

(22) Filed: Aug. 21, 2019

(65) Prior Publication Data

US 2020/0066665 A1 Feb. 27, 2020

(30) Foreign Application Priority Data

Aug. 23, 2018 (JP) .............................. JP2018-156608

(51) Int. Cl.
| | | |
|---|---|---|
| *H01L 23/00* | (2006.01) | |
| *H01L 29/739* | (2006.01) | |
| *H01L 29/06* | (2006.01) | |
| *H01L 29/423* | (2006.01) | |
| *H01L 21/768* | (2006.01) | |

(52) U.S. Cl.
CPC ........ *H01L 24/05* (2013.01); *H01L 21/76816* (2013.01); *H01L 24/06* (2013.01); *H01L 29/0692* (2013.01); *H01L 29/4236* (2013.01); *H01L 29/7397* (2013.01); *H01L 2224/04042* (2013.01); *H01L 2224/05564* (2013.01); *H01L 2924/13055* (2013.01)

(58) Field of Classification Search
CPC . H01L 24/05; H01L 29/0692; H01L 29/4236; H01L 29/7397; H01L 2224/04042; H01L 2224/05564; H01L 2924/13055; H01L 21/76816; H01L 24/06
See application file for complete search history.

(56) References Cited

U.S. PATENT DOCUMENTS

| | | | | |
|---|---|---|---|---|
| 2016/0163647 | A1* | 6/2016 | Iwasaki ............ | H01L 21/76832 257/751 |
| 2016/0172301 | A1* | 6/2016 | Iwasaki ............ | H01L 21/76843 257/751 |

FOREIGN PATENT DOCUMENTS

| | | |
|---|---|---|
| JP | 2016111084 A | 6/2016 |
| JP | 2016115698 A | 6/2016 |

* cited by examiner

*Primary Examiner* — Feifei Yeung Lopez
(74) *Attorney, Agent, or Firm* — Hunton Andrews Kurth LLP

(57) ABSTRACT

A semiconductor device may include a semiconductor substrate, an insulator film provided directly or indirectly on the semiconductor substrate, a main electrode for power provided on the insulator film, a pad for signal provided on the insulator film. The insulator film may include a cell region where the main electrode is provided and a pad region where the pad is provided. The cell region and the pad region of the insulator film each may include a contact hole. A height position of the contact hole located within the pad region may be higher than a height position of the contact hole located within the cell region. A width of the contact hole located within the pad region may be greater than a width of the contact hole located within the cell region.

10 Claims, 3 Drawing Sheets

Evaluation Result on Bonded Wire

SEMICONDUCTOR DEVICE

CROSS-REFERENCE

This application claims priority to Japanese Patent Application No. 2018-156608, filed on Aug. 23, 2018, the entire contents of which are incorporated herein by reference.

TECHNICAL FIELD

The technique disclosed herein relates to a semiconductor device.

BACKGROUND

Japanese Patent Application Publication No. 2016-111084 describes a semiconductor device. This semiconductor device includes a semiconductor substrate, an insulator film provided on the semiconductor substrate, and a main electrode for power and a pad for signal that are provided on the insulator film. In each of a region where the main electrode is provided (hereinafter, referred to as a cell region) and a region where the pad is provided (hereinafter, referred to as a pad region), a contact hole is provided in the insulator film. Each contact hole is provided with a contact plug therein which is connected to corresponding one of the main electrode and the pad.

SUMMARY

In the above-described semiconductor device, the cell region and the pad region are different from each other in their structures provided on the semiconductor substrate. In particular, a height position of the contact hole located within the pad region is higher than a height position of the contact hole located within the cell region. With this configuration, in forming the contact holes by photolithography, the exposure focus cannot be directed on all the contact holes accurately. That is, directing the focus on the contact hole located within the cell region brings the contact hole located within the pad region out of the focus. In this case, the contact hole located within the pad region may be formed with a smaller dimension than its designed value. If a contact hole is smaller than its intended dimension, that contact hole may not be sufficiently filled with a contact plug. In this case, defects, such as cavities (also referred to as pores), may be caused within a pad that is formed thereafter. The present disclosure herein provides a technique that can suppress such manufacturing defects in a pad.

A semiconductor device disclosed herein may comprise a semiconductor substrate, an insulator film provided directly or indirectly on the semiconductor substrate, a main electrode for power provided on the insulator film, and a pad for signal provided on the insulator film. In each of a cell region where the main electrode is provided and a pad region where the pad is provided, a contact hole may be provided in the insulator film. A height position of the contact hole located within the pad region may be higher than a height position of the contact hole located within the cell region, and a width of the contact hole located within the pad region may be greater than a width of the contact hole located within the cell region. Herein, a height position of a contact hole means a height position of a top end (i.e., a lip) of the contact hole, and a width of the contact hole means a width at the top end of the contact hole.

In the above-described semiconductor device, the height position of the contact hole located within the pad region is higher than the height position of the contact hole located within the cell region. Therefore, as described earlier, the contact hole located within the pad region may be formed with a smaller dimension than its designed value when formed by photolithography. However, the width of the contact hole located within the pad region is designed to be greater than the width of the contact hole located within the cell region. Thus, even if the contact hole located within the pad region is formed to be smaller than its intended dimension, the contact hole can be sufficiently filled with a contact plug because the width of the contact hole is relatively large. Accordingly, it is possible to suppress defective formation of the contact plug and a manufacturing defect caused by the defective formation.

DETAILED DESCRIPTION

Figure 1:
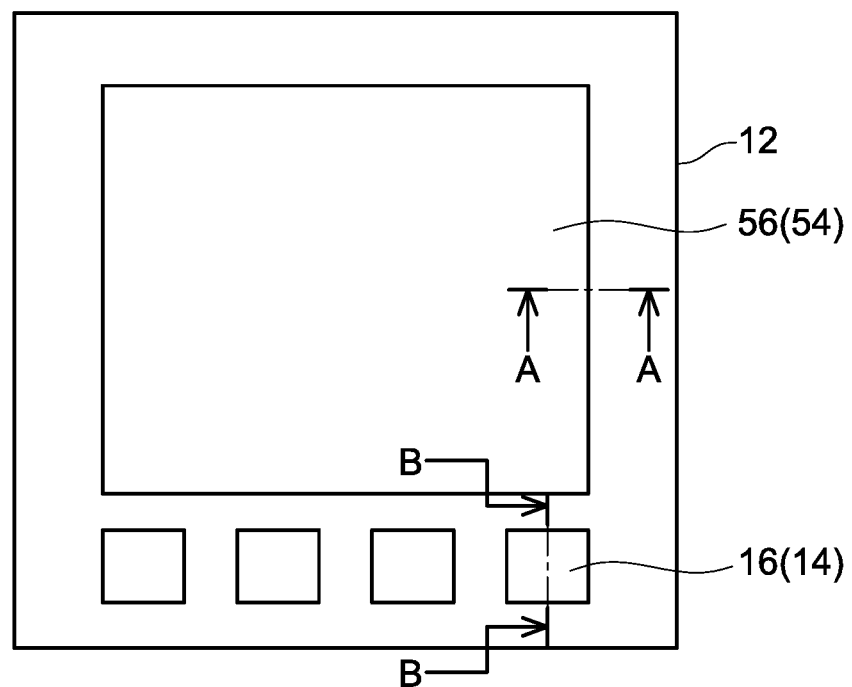
FIG. 1 is a plan view of a semiconductor device 10.

In an embodiment of the present disclosure, a contact hole located within a pad region may comprise a top end located close to a pad and a bottom end located close to a semiconductor substrate. The width of the contact hole located within the pad region may be greater at the top end than at the bottom end. By this configuration, the contact hole can be filled easily with a contact plug (or the pad). Thus, it is possible to further suppress defective formation of the contact plug and a manufacturing defect of the pad caused by the defective formation.

In the above-described embodiment, the width of the contact hole located within the pad region may continuously increase from the bottom end of that contact hole toward the top end thereof. By this configuration, it is possible to effectively suppress formation of a cavity within the contact plug when the contact hole is filled with the contact plug. Therefore, it is possible to further suppress defective formation of the contact plug and a manufacturing defect of the pad caused by the defective formation of the contact plug.

In the above-described embodiment, the width at the top end of the contact hole located within the pad region may be more than 1.3 times as large as the width at the bottom end of that contact hole. It has been confirmed by a test that evaluated mechanical strength of the pad (see FIG. 4) that this configuration sufficiently suppresses a manufacturing defect of the pad.

In an embodiment of the present disclosure, a contact plug may be provided in the contact hole located within the pad region and a material of the contact plug may be different from a material of the pad. In this case, a top surface of the contact plug may be in contact with the pad, may be dented in a V-shape and may form an angle larger than 90 degrees at a deepest point of the top surface. In a case where the contact plug is formed by deposition (for example, sputtering) and etching, the top surface of the contact plug is dented in a V-shape. In this case, it has been confirmed that a cavity is formed within the pad which is to be formed thereafter and mechanical strength of the pad is thereby likely to decrease if the angle formed at the deepest point is an acute angle, which is smaller than 90 degrees. On the other hand, it has been confirmed that the pad satisfies its required mechanical strength if the angle formed at the deepest point is an obtuse angle, which is an angle larger than 90 degrees.

Representative, non-limiting examples of the present disclosure will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

As illustrated in FIG. 1, a semiconductor device 10 according to an embodiment includes a semiconductor substrate 12. The semiconductor substrate 12 is constituted of silicon, although not specifically limited thereto. An emitter electrode 56 and a plurality of bonding pads 16 are provided above a top surface 12a of the semiconductor substrate 12. The emitter electrode 56 is an example of a main electrode for power in this technique, and the bonding pad 16 is an example of a pad for signal in this technique. Further, in the disclosure herein, a region where the emitter electrode 56 is provided is referred to as a cell region 54, and a region where the bonding pads 16 is provided is referred to as a pad region 14.

Figure 2:
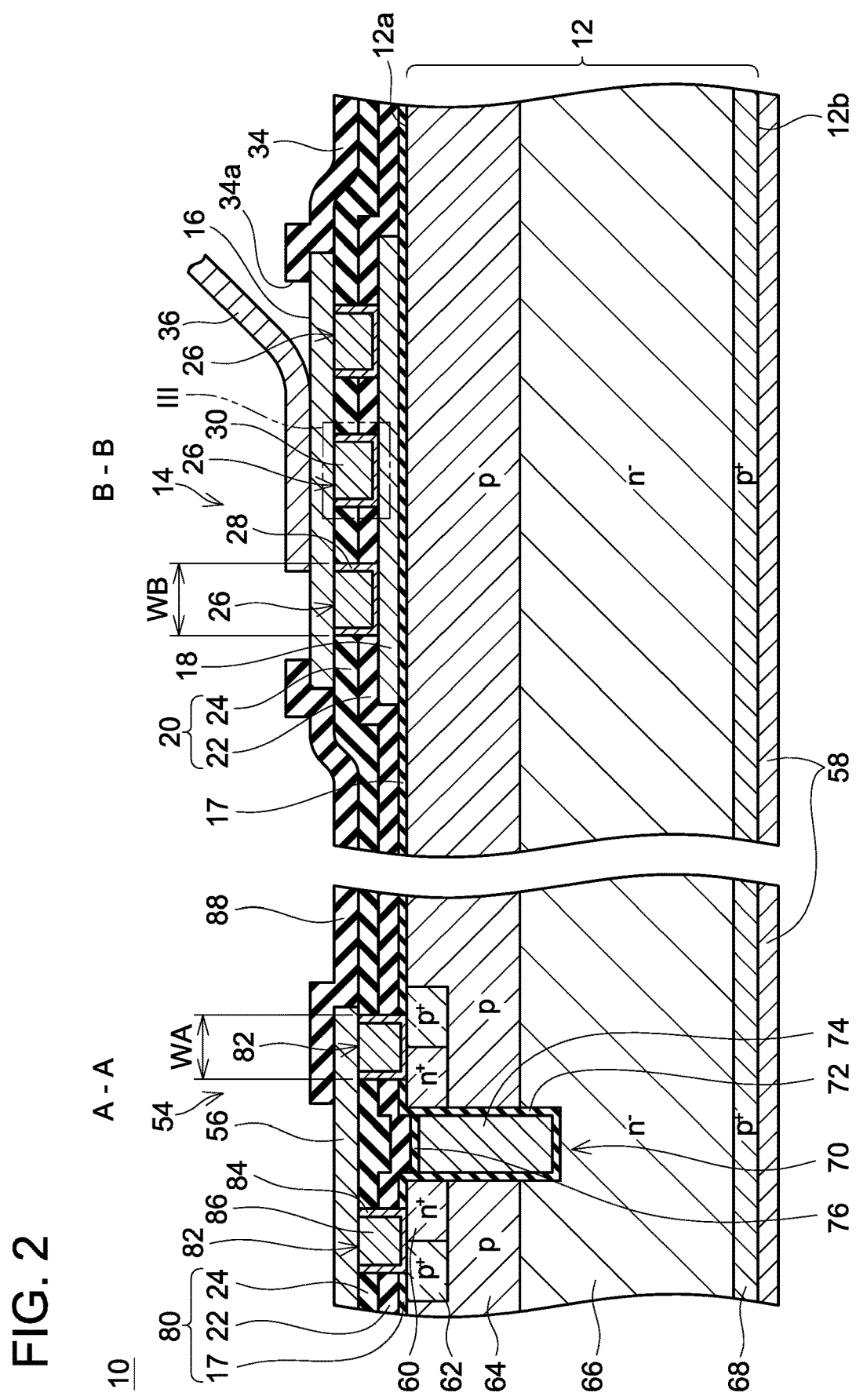
FIG. 2 shows cross-sectional views of the semiconductor device 10, taken along a line A-A and a line B-B in FIG. 1.

FIG. 2 shows cross-sectional views of the semiconductor device 10. FIG. 2 shows a cross-sectional view of the cell region 54 taken along a line A-A in FIG. 1 and a cross-sectional view of the pad region 14 taken along a line B-B in FIG. 1, side by side. A collector electrode 58 is provided on a bottom surface 12b of the semiconductor surface 12 to extend across the pad region 14 and the cell region 54.

First, a structure of the pad region 14 will be described. A surface oxide film 17 is provided on the top surface 12a of the semiconductor substrate 12 within the pad region 14. The surface oxide film 17 is constituted of silicon oxide (SiO$_2$), although not specifically limited thereto. The surface oxide film 17 covers an entirety of the top surface 12a of the semiconductor substrate 12 within the pad region 14. The surface oxide film 17 is obtained by oxidizing the semiconductor substrate 12. Gate wiring 18 is provided on the surface oxide film 17. The gate wiring 18 is constituted of polysilicon, although not specifically limited thereto. Aluminum (Al) is introduced into polysilicon that constitutes the gate wiring 18 as p-type impurities. Boron (B) can be used as the p-type impurities, however, it has been confirmed that mechanical strength of the gate wiring 18 can decrease with use of boron (B).

An insulator film 20 is provided on the surface oxide film 17 and the gate wiring 18. The insulator film 20 is constituted of silicon oxide (SiO$_2$), although not specifically limited thereto. The insulator film 20 covers a top surface of the gate wiring 18 and a part of a top surface of the surface oxide film 17 on which the gate wiring 18 is not provided. The insulator film 20 includes an NSG film 22 and a BPSG film 24. The NSG film 22 is constituted of NSG (Non-doped Silicon Glass). That is, the NSG film 22 is constituted of SiO$_2$ with neither of boron or phosphorus doped therein. The NSG film 22 is provided on the surface oxide film 17 and the gate wiring 18. The BPSG film 24 is constituted of BPSG (Boron Phosphorus Silicon Glass). That is, the BPSG film 24 is constituted of SiO$_2$ with boron and phosphorus doped therein. The BPSG film 24 is provided on the NSG film 22.

A plurality of contact holes 26 is provided in the insulator film 20. Each contact hole 26 penetrates through a portion of the insulator film 20 that is located on the gate wiring 18, from a top surface to a lower surface thereof. Bottom surfaces of the contact holes 26 are configured by the gate wiring 18. An inner surface of each contact hole 26 (that is, the top surface of the gate wiring 18 that configures the bottom surface of the contact hole 26, and a side surface of the contact hole 26 defined by the insulator film 20) is covered by a barrier metal 28 constituted of titanium (Ti). The barrier metals 28 are provided only within the contact holes 26, and are not provided on the top surface of the insulator film 20. A contact plug 30 is arranged within each contact hole 26. The contact plugs 30 are a metal filling in the contact holes 26 and are constituted of tungsten (W) in this embodiment. The contact plugs 30 cover surfaces of the barrier metals 28. In another embodiment, the contact plugs 30 may be constituted of a different material from tungsten, and may be constituted of the same material as the bonding pads 16, for example.

As illustrated in FIG. 2, the bonding pad 16 is provided on the top surfaces of the insulator film 20 and the contact plugs 30. The bonding pad 16 is an electrode for inputting and/or outputting a voltage signal or a current signal. The bonding pad 16 is constituted of a metal. In one example, the bonding pad 16 of this embodiment is constituted of Al—Si alloy. The bonding pad 16 is connected to the gate wiring 18 via the contact plugs 30 and the barrier metals 28. No barrier metal 28 is present between the bonding pad 16 and the BPSG film 24, and the bonding pad 16 is in direct contact with the BPSG film 24.

A protection film 34 is provided on the insulator film 20 that is located in a range where no bonding pad 16 is provided. The protection film 34 is an insulating film. In one example, the protection film 34 may be configured by a polyimide film, a SiN film, or a laminated film in which a polyimide film is stacked on a SiN film. The protection film 34 is provided with an opening 34a, through which the bonding pad 16 is exposed. One end of a wire 36 is bonded to the bonding pad 16. Another end of the wire 36 is connected to a terminal for signal (not illustrated), for example.

Next, the cell region 54 will be described. An IGBT (Insulated Gate Bipolar Transistor) is provided within the cell region 54. The IGBT has the following configuration. The semiconductor substrate 12 within the cell region 54 is provided with an emitter region 60, a body contact region 62, a body region 64, a drift region 66, and a collector region 68. The emitter region 60 is n$^+$-type and is provided so as to be disposed at the top surface 12a of the semiconductor substrate 12. The body contact region 62 is p$^+$-type and is provided so as to be disposed at the top surface 12a of the semiconductor substrate 12. The body region 64 is p-type and is provided below the emitter region 60 and the body contact region 62. A p-type impurity concentration of the body region 64 is lower than that of the body contact region 62. The drift region 66 is n$^-$-type and is provided below the body region 64. The collector region 68 is p$^+$-type and is provided below the drift region 66. The collector region 68 is provided so as to be disposed at the bottom surface 12b of the semiconductor substrate 12. The collector region 68 is connected to the collector electrode 58. The body region 64, the drift region 66, and the collector region 68 are also provided in the semiconductor substrate 12 located within the pad region 14. In place of or in addition to the IGBT, the semiconductor substrate 12 within the cell region 54 may be provided with another device structure, such as a MOSFET (Metal-Oxide Semiconductor Field-Effect Transistor) or a diode.

A trench 70 is provided in the top surface 12a of the semiconductor substrate 12 within the cell region 54. The trench 70 penetrates through the emitter region 60 and the body region 64 to reach the drift region 66. An inner surface of the trench 70 is covered by a gate insulator film 72. A gate electrode 74 is provided within the trench 70. The gate electrode 74 is insulated from the semiconductor substrate 12 by the gate insulator film 72. The gate electrode 74 is opposed to the emitter region 60, the body region 64, and the drift region 66 via the gate insulator film 72. The gate electrode 74 is connected to the above-described gate wiring 18 at a position that is not illustrated. The gate electrode 74 is electrically connected to the bonding pad 16 via the gate wiring 18. A top surface of the gate electrode 74 is covered by a cap insulator film 76.

The top surface 12a of the semiconductor substrate 12 within the cell region 54 is covered by an insulator film 80. The insulator film 80 is constituted of silicon oxide (SiO$_2$), although not specifically limited thereto. The insulator film 80 includes the surface oxide film 17, the NSG film 22, and the BPSG film 24 described above. That is, within the cell region 54, the surface oxide film 17, the NSG film 22, and the BPSG film 24 are stacked on the top surface 12a of the semiconductor substrate 12 and these films configure the insulator film 80.

The insulator film 80 is provided with a plurality of contact holes 82. Each contact hole 82 penetrates through the insulator film 80 from a top surface to a bottom surface thereof. Bottom surfaces of the contact holes 82 are configured by the top surface 12a of the semiconductor substrate 12. The emitter region 60 and the body contact region 62 is disposed at the bottom surfaces of the contact holes 82. An inner surface of each contact hole 82 (that is, the top surface 12a of the semiconductor substrate 12 that configures the bottom surface of the contact hole 82, and a side surface of the contact hole 82 defined by the insulator film 80) is covered by a barrier metal 84. The barrier metals 84 are provided only within the contact holes 82, and are not provided on the top surface of the insulator film 80. A contact plug 86 is arranged within each contact hole 82. The contact plugs 86 are a metal filling in the contact holes 82 and are constituted of tungsten in this embodiment. The contact plugs 86 cover surfaces of the barrier metals 84.

The emitter electrode 56 is provided on the top surfaces of the insulator film 80 and the contact plugs 86. The emitter electrode 56 is constituted of a metal. In one example, the emitter electrode 56 of this embodiment is constituted of Al—Si alloy. The emitter electrode 56 is connected to the emitter region 60 and the body contact region 62 via the contact plugs 86 and the barrier metals 84. Further, no barrier metal 84 is present between the emitter electrode 56 and the BPSG film 24, and the emitter electrode 56 is in direct contact with the BPSG film 24. A polyimide film 88 is provided on the insulator film 80 that is located in a range where no emitter electrode 56 is provided. The polyimide film 88 is an insulating film. The polyimide film 88 also covers an end portion of the emitter electrode 56. A portion of the emitter electrode 56 that is not covered by the polyimide film 88 is connected to an external conductive member by solder, although this is not illustrated.

As illustrated in FIG. 2, the cell region 54 and the pad region 14 are different from each other in their structures provided on the semiconductor substrate 12. In particular, a height position of the contact holes 26 located within the pad region 14 is higher than a height position of the contact holes 82 located within the cell region 54. With the configuration where the height positions of the contact holes 26 and 82 are different between the cell region 54 and the pad region 14, in forming the contact holes 26 and 82 by photolithography, the exposure focus cannot be directed on all the contact holes 26 and 82 accurately. That is, directing the focus on the contact holes 82 located within the cell region 54 brings the contact holes 26 located within the pad region 14 out of the focus. In this case, the contact holes 26 located within the pad region 14 may be formed with a smaller dimension than their designed value.

Considering the above, in the semiconductor device 10 of this embodiment, a width WB of the contact holes 26 located within the pad region 14 is designed to be greater than a width WA of the contact holes 82 located within the cell region 54. Therefore, even when the contact holes 26 within the pad region 14 are formed to be smaller than their intended dimension, the contact holes 26 can be sufficiently filled with the contact plugs 30 because the width WB of the contact holes 26 is relatively large. Accordingly, even when the height positions of the contact holes 26 and 82 are different between the cell region 54 and the pad region 14, it is possible to suppress defective formation of the contact plugs 30 and a manufacturing defect of the bonding pads 16 caused by the defective formation.

Figure 3:
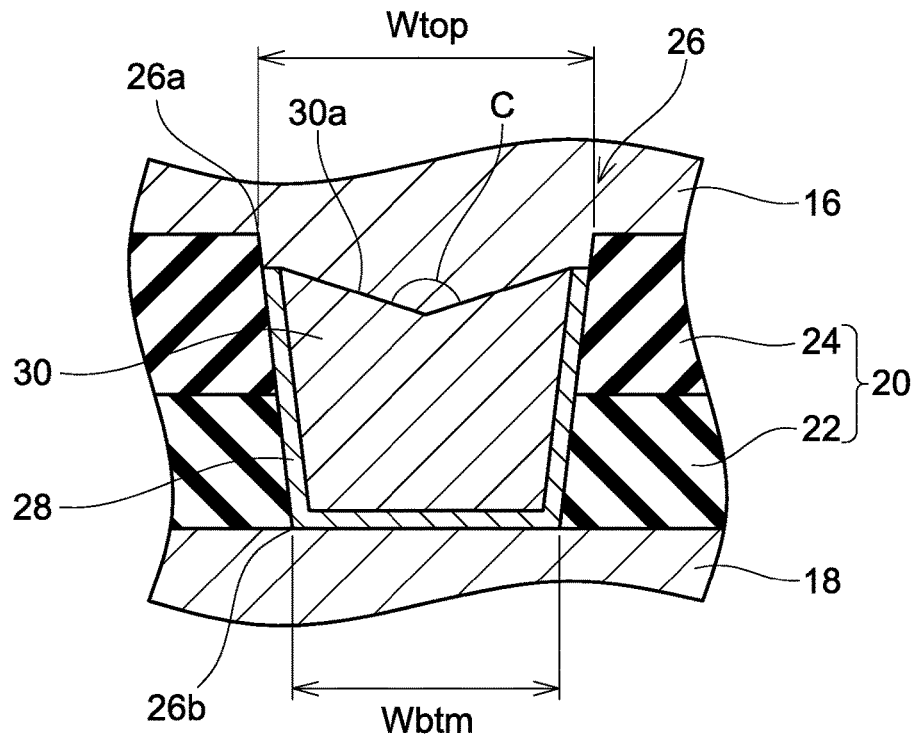
FIG. 3 is an enlarged view of a portion III in FIG. 2, which illustrates a cross-sectional structure of a contact hole 26 located within a pad region 14.

As illustrated in FIG. 3, in the contact hole 26 located within the pad region 14, a width Wtop at a top end 26a thereof located close to the bonding pad 16 may be greater than a width Wbtm at a bottom end 26b thereof located close to the semiconductor substrate. In this configuration, the contact hole 26 can be easily filled with the contact plug 30 and the bonding pad 16, without forming a cavity therein. Therefore, it is possible to further suppress defective formation of the contact plugs 30 and a manufacturing defect of the bonding pads 16 caused by the defective formation. The aforementioned width WB of the contact holes 26 is a representative value (e.g., an average value) between the width Wbtm at the bottom end 26b and the width Wtop at the top end 26a, and satisfies a relation of: the width Wbtm<the width WB<the width Wtop.

In addition, the width WB of the contact holes 26 located within the pad region 14 continuously increases from the bottom ends 26b (the width Wbtm) toward the top ends 26a (the width Wtop) of the contact holes 26. By this configuration, it is possible to effectively suppress formation of a cavity within the contact plugs 30 when the contact holes 26 are filled with the contact plugs 30. Therefore, it is possible to further suppress defective formation of the contact plugs 30 and a manufacturing defect of the bonding pads 16 caused by the defective formation.

Figure 4:
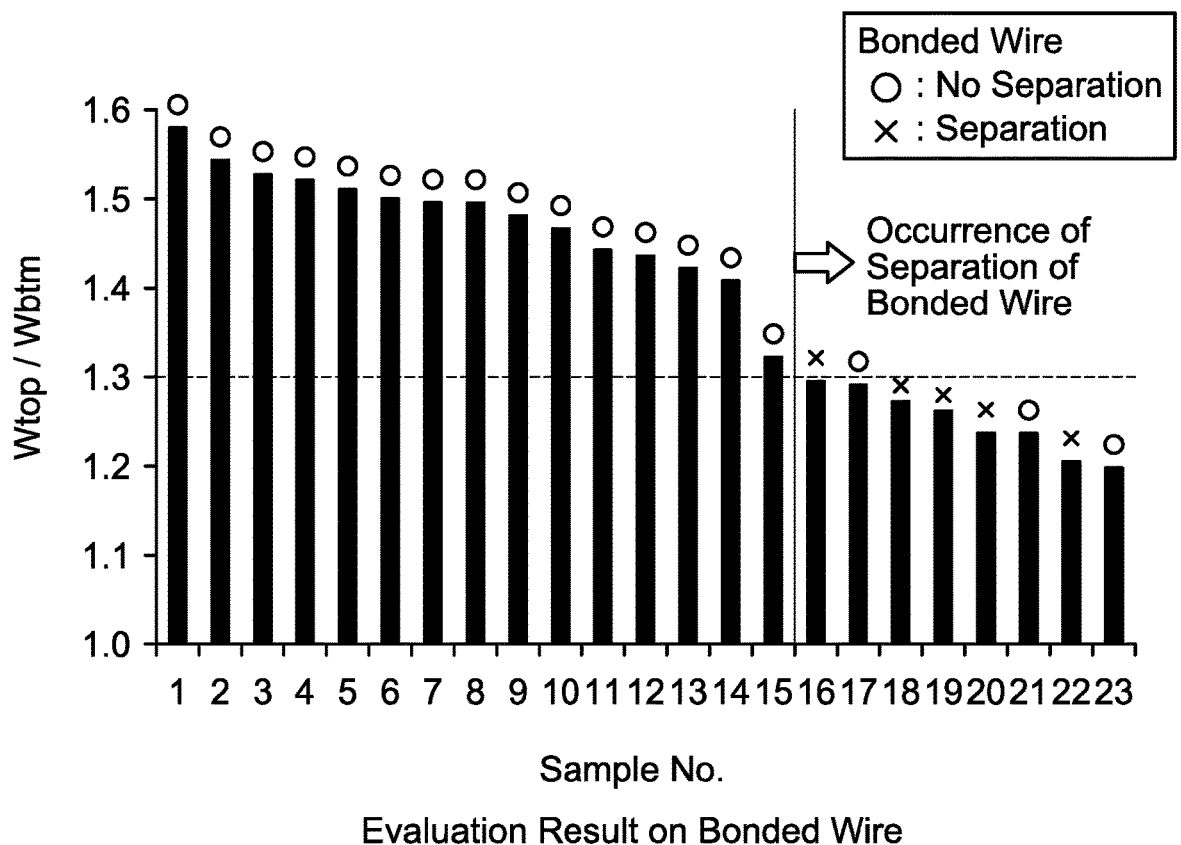
FIG. 4 shows an evaluation result on mechanical strength of bonding pads 16 with regard to a plurality of samples (No. 1 to 23) that are different from one another in a ratio Wtop/Wbtm of widths at top and bottom ends 26a and 26b of the contact hole 26.

FIG. 4 shows an evaluation result on mechanical strength of the bonding pads 16 with regard to a plurality of samples (No. 1 to 23) that are different from one another in a ratio Wtop/Wbtm between the widths of the contact holes 26 at the top and bottom ends 26a and 26b. Specifically, for each sample, the wire 36 was bonded to the bonding pad 16 by ultrasonic joining, and thereafter it was checked whether or not the wire 36 was separated when a predetermined load is applied thereto. In a bar chart of FIG. 4, a length of each bar represents a value of the width ratio Wtop/Wbtm in its corresponding sample. A circle labeled above the bar represents that the sample did not exhibit separation of the wire 36, and a cross mark labeled above the bar represents that the sample exhibited separation of the wire 36. That is, the mechanical strength of the bonding pad 16 was sufficient in the samples with the circle, whereas the mechanical strength of the bonding pad 16 was insufficient in the samples with the cross mark.

As is understood from the evaluation result in FIG. 4, it has been confirmed that separation of the wire 36 did not occur in the samples with the width ratio Wtop/Wbtm of larger than 1.3 (No. 1 to 15) and the bonding pad 16 had sufficient mechanical strength. From this fact, it is effective to set the width Wtop at the top ends 26a of the contact holes 26 located within the pad region 14 to be more than 1.3 times as large as the width Wbtm at the bottom ends 26b of the contact holes 26. However, it has been confirmed that even when the width ratio Wtop/Wbtm was equal to or less than 1.3, the bonding pad 16 had sufficient mechanical strength in several samples (No. 17, 21, and 23). From this fact, the width ratio Wtop/Wbtm does not necessarily exceed 1.3. In another embodiment, the widths Wtop and Wbtm at the top and bottom ends 26a and 26b may be the same as each other, that is, the width WB of the contact holes 26 located within the pad region 14 may be constant along their depth direction.

Returning to FIG. 3, the contact plug 30 can be formed by a combination of deposition (e.g., sputtering) and etching in the semiconductor device 10 of this embodiment. Specifically, first, a material of the contact plug 30 (tungsten in this embodiment) is deposited on the insulator film 20 in which the contact hole 26 has been formed. Subsequently, an excess portion of the material film, which was formed outside the contact hole 26, is removed by etching. In the case where the contact plug 30 is formed in accordance with this procedure, a top surface 30a of the contact plug 30 is dented in a V-shape. In this case, if an angle C formed at a deepest portion of the V-shaped top surface 30a is an acute angle smaller than 90 degrees, it has been confirmed that a cavity is formed inside the bonding pad 16 which is to be formed thereafter and the mechanical strength of the bonding pad 16 is thereby likely to decrease. On the other hand, if the angle C formed at the deepest portion is an obtuse angle larger than 90 degrees, it has been confirmed that the bonding pad 16 satisfies its required mechanical strength. Therefore, in the case where the top surface 30a of the contact plug 30, which is in contact with the bonding pad 16, is dented in a V-shape, the angle C formed at the deepest portion may be larger than 90 degrees, although not specifically limited so.

What is claimed is:

1. A semiconductor device, comprising:
   a semiconductor substrate;
   an insulator film provided directly or indirectly on the semiconductor substrate;
   a main electrode for power provided on the insulator film; and
   a pad for signal provided on the insulator film,
   wherein
   the insulator film comprises a cell region where the main electrode is provided and a pad region where the pad is provided,
   the cell region and the pad region of the insulator film each comprise a contact hole,
   a height position of the contact hole located within the pad region is higher than a height position of the contact hole located within the cell region,
   a width of the contact hole located within the pad region is greater than a width of the contact hole located within the cell region,
   a contact plug is provided in the contact hole located within the pad region,
   a material of the contact plug is different from a material of the pad,
   a top surface of the contact plug is in contact with the pad, and
   the top surface of the contact plug is dented in a V-shape and forms an angle larger than 90 degrees at a deepest point of the top surface.

2. The semiconductor device according to claim 1, wherein
   the contact hole located within the pad region comprises a top end located close to the pad and a bottom end located close to the semiconductor substrate, and
   the width of the contact hole located within the pad region is greater at the top end than at the bottom end.

3. The semiconductor device according to claim 2, wherein the width of the contact hole located within the pad region continuously increases from the bottom end toward the top end.

4. The semiconductor device according to claim 2, wherein the width at the top end of the contact hole located within the pad region is more than 1.3 times as large as the width at the bottom end of the contact hole located within the pad region.

5. A semiconductor device, comprising:
   a semiconductor substrate;
   an insulator film provided directly or indirectly on the semiconductor substrate;
   a main electrode for power provided on the insulator film; and
   a pad for signal provided on the insulator film,
   wherein
   the insulator film comprises a cell region where the main electrode is provided and a pad region where the pad is provided,
   the cell region and the pad region of the insulator film each comprise a contact hole,
   a height position of the contact hole located within the pad region is higher than a height position of the contact hole located within the cell region,
   a width of the contact hole located within the pad region is greater than a width of the contact hole located within the cell region, and
   a contact plug is provided in the contact hole located within the pad region, wherein a top surface of the contact plug is in contact with the pad, and the top surface of the contact plug is dented in a V-shape.

6. The semiconductor device according to claim 5, wherein the top surface of the contact plug forms an angle larger than 90 degrees at a deepest point of the top surface.

7. A semiconductor device, comprising:
a semiconductor substrate;
an insulator film provided directly or indirectly on the semiconductor substrate;
a main electrode for power provided on the insulator film; and
a pad for signal provided on the insulator film,
wherein
the insulator film comprises a cell region where the main electrode is provided and a pad region where the pad is provided,
the cell region and the pad region of the insulator film each comprise a contact hole, and
a contact plug is provided in the contact hole located within the pad region,
wherein a top surface of the contact plug is in contact with the pad, and the top surface of the contact plug is dented in a V-shape.

8. The semiconductor device according to claim 7, wherein the top surface of the contact plug forms an angle larger than 90 degrees at a deepest point of the top surface.

9. The semiconductor device according to claim 7, wherein a height position of the contact hole located within the pad region is higher than a height position of the contact hole located within the cell region.

10. The semiconductor device according to claim 7, wherein a width of the contact hole located within the pad region is greater than a width of the contact hole located within the cell region.

* * * * *